US008400212B1

(12) United States Patent
Nguyen et al.

(10) Patent No.: US 8,400,212 B1
(45) Date of Patent: Mar. 19, 2013

(54) HIGH VOLTAGE CHARGE PUMP REGULATION SYSTEM WITH FINE STEP ADJUSTMENT

(75) Inventors: Qui Vi Nguyen, San Jose, CA (US); Trung Pham, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/240,623

(22) Filed: Sep. 22, 2011

(51) Int. Cl.
*G05F 1/10* (2006.01)
(52) U.S. Cl. ........................................ 327/536
(58) Field of Classification Search ........................ None
See application file for complete search history.

(56) References Cited

U.S. PATENT DOCUMENTS

| | | |
|---|---|---|
| 3,697,860 A | 10/1972 | Baker |
| 4,271,461 A | 6/1981 | Hoffmann et al. |
| 4,511,811 A | 4/1985 | Gupta |
| 4,583,157 A | 4/1986 | Kirsch et al. |
| 4,636,748 A | 1/1987 | Latham |
| 4,736,121 A | 4/1988 | Cini et al. |
| 4,888,738 A | 12/1989 | Wong et al. |
| 5,140,182 A | 8/1992 | Ichimura |
| 5,168,174 A | 12/1992 | Naso et al. |
| 5,175,706 A | 12/1992 | Edme |
| 5,263,000 A | 11/1993 | Van Buskirk et al. |
| 5,335,198 A | 8/1994 | Van Buskirk et al. |
| 5,392,205 A | 2/1995 | Zavaleta |
| 5,436,587 A | 7/1995 | Cernea |
| 5,483,434 A | 1/1996 | Seesink |
| 5,508,971 A | 4/1996 | Cernea et al. |
| 5,521,547 A | 5/1996 | Tsukada |
| 5,563,779 A | 10/1996 | Cave et al. |
| 5,563,825 A | 10/1996 | Cernea et al. |
| 5,568,424 A | 10/1996 | Cernea et al. |
| 5,570,315 A | 10/1996 | Tanaka et al. |

(Continued)

FOREIGN PATENT DOCUMENTS

| | | |
|---|---|---|
| DE | 10 2007 026290 | 7/2008 |
| EP | 0 382 929 A | 8/1990 |
| EP | 0 780 515 A | 6/1997 |
| JP | 2007-020268 A | 1/2007 |
| WO | 01/06336 A1 | 1/2001 |
| WO | WO 2006/132757 | 12/2006 |

OTHER PUBLICATIONS

Feng Pan et al., "Charge Pump Circuit Design", McGraw-Hill, 2006, 26 pages.

(Continued)

*Primary Examiner* — Lincoln Donovan
*Assistant Examiner* — Sibin Chen
(74) *Attorney, Agent, or Firm* — Davis Wright Tremaine LLP

(57) ABSTRACT

A regulator system for a charge pump system divides the binary decoding into two branches. One controls a set of parallel connected resistors for fine output voltage steps. The other branch controls a serial resistor to provide the large step size. For example, a 9-bit digital input signal is split into 2 least significant bits for the fine adjustment and the other 7 bits for the larger adjustments. In the example of a 50 mV step size, in one current path 2 bits of the binary input then control two parallel resistors for 50 mV and 100 mV step size, and in the other current path 7 bits are used for one-hot-decode control serial resistors to provide a 200 mV step size. A unity gain operational amplifier and a high voltage device are added in between the two branches to decouple the parasitic capacitance of large parallel resistors from the other elements.

7 Claims, 3 Drawing Sheets

U.S. PATENT DOCUMENTS

| | | |
|---|---|---|
| 5,592,420 A | 1/1997 | Cernea et al. |
| 5,596,532 A | 1/1997 | Cernea et al. |
| 5,602,794 A | 2/1997 | Javanifard et al. |
| 5,621,685 A | 4/1997 | Cernea et al. |
| 5,625,544 A | 4/1997 | Kowshik et al. |
| 5,693,570 A | 12/1997 | Cernea et al. |
| 5,732,039 A | 3/1998 | Javanifard et al. |
| 5,734,286 A | 3/1998 | Takeyama et al. |
| 5,767,735 A | 6/1998 | Javanifard et al. |
| 5,781,473 A | 7/1998 | Javanifard et al. |
| 5,801,987 A | 9/1998 | Dinh |
| 5,818,766 A | 10/1998 | Song |
| 5,828,596 A | 10/1998 | Takata et al. |
| 5,903,495 A | 5/1999 | Takeuchi et al. |
| 5,943,226 A | 8/1999 | Kim |
| 5,945,870 A | 8/1999 | Chu et al. |
| 5,969,565 A | 10/1999 | Naganawa |
| 5,973,546 A | 10/1999 | Le et al. |
| 5,982,222 A | 11/1999 | Kyung |
| 6,008,690 A | 12/1999 | Takeshima et al. |
| 6,018,264 A | 1/2000 | Jin |
| 6,023,187 A | 2/2000 | Camacho et al. |
| 6,026,002 A | 2/2000 | Viehmann |
| 6,046,935 A | 4/2000 | Takeuchi et al. |
| 6,104,225 A | 8/2000 | Taguchi et al. |
| 6,107,862 A | 8/2000 | Mukainakano et al. |
| 6,134,145 A | 10/2000 | Wong |
| 6,151,229 A | 11/2000 | Taub et al. |
| 6,154,088 A | 11/2000 | Chevallier et al. |
| 6,188,590 B1 | 2/2001 | Chang et al. |
| 6,198,645 B1 | 3/2001 | Kotowski et al. |
| 6,208,198 B1 | 3/2001 | Lee |
| 6,249,445 B1 | 6/2001 | Sugasawa |
| 6,249,898 B1 | 6/2001 | Koh et al. |
| 6,285,622 B1 | 9/2001 | Haraguchi et al. |
| 6,297,687 B1 | 10/2001 | Sugimura |
| 6,307,425 B1 | 10/2001 | Chevallier et al. |
| 6,314,025 B1 | 11/2001 | Wong |
| 6,320,428 B1 | 11/2001 | Atsumi et al. |
| 6,320,796 B1 | 11/2001 | Voo et al. |
| 6,329,869 B1 | 12/2001 | Matano |
| 6,344,959 B1 | 2/2002 | Milazzo |
| 6,344,984 B1 | 2/2002 | Miyazaki |
| 6,359,798 B1 | 3/2002 | Han et al. |
| 6,369,642 B1 | 4/2002 | Zeng et al. |
| 6,370,075 B1 | 4/2002 | Haeberli et al. |
| 6,400,202 B1 | 6/2002 | Fifield et al. |
| 6,404,274 B1 | 6/2002 | Hosono et al. |
| 6,424,570 B1 | 7/2002 | Le et al. |
| 6,445,243 B2 | 9/2002 | Myono |
| 6,456,170 B1 | 9/2002 | Segawa et al. |
| 6,476,666 B1 | 11/2002 | Palusa et al. |
| 6,486,728 B2 | 11/2002 | Kleveland |
| 6,518,830 B2 | 2/2003 | Gariboldi et al. |
| 6,525,614 B2 | 2/2003 | Tanimoto |
| 6,525,949 B1 | 2/2003 | Johnson et al. |
| 6,531,792 B2 | 3/2003 | Oshio |
| 6,538,930 B2 | 3/2003 | Ishii et al. |
| 6,545,529 B2 | 4/2003 | Kim |
| 6,556,465 B2 | 4/2003 | Wong et al. |
| 6,577,535 B2 | 6/2003 | Pasternak |
| 6,606,267 B2 | 8/2003 | Wong |
| 6,724,241 B1 | 4/2004 | Bedarida et al. |
| 6,734,718 B1 | 5/2004 | Pan |
| 6,760,262 B2 | 7/2004 | Haeberli et al. |
| 6,781,440 B2 | 8/2004 | Huang |
| 6,798,274 B2 | 9/2004 | Tanimoto |
| 6,819,162 B2 | 11/2004 | Pelliconi |
| 6,834,001 B2 | 12/2004 | Myono |
| 6,859,091 B1 | 2/2005 | Nicholson et al. |
| 6,878,981 B2 | 4/2005 | Eshel |
| 6,891,764 B2 | 5/2005 | Li |
| 6,894,554 B2 | 5/2005 | Ito |
| 6,922,096 B2 | 7/2005 | Cernea |
| 6,927,441 B2 | 8/2005 | Pappalardo et al. |
| 6,933,768 B2 | 8/2005 | Hausmann |
| 6,944,058 B2 | 9/2005 | Wong |
| 6,975,135 B1 | 12/2005 | Bui |
| 6,990,031 B2 | 1/2006 | Hashimoto et al. |
| 6,995,603 B2 | 2/2006 | Chen et al. |
| 7,002,381 B1 | 2/2006 | Chung |
| 7,023,260 B2 | 4/2006 | Thorp et al. |
| 7,030,683 B2 | 4/2006 | Pan et al. |
| 7,113,023 B2 | 9/2006 | Cernea |
| 7,116,154 B2 | 10/2006 | Guo |
| 7,116,155 B2 | 10/2006 | Pan |
| 7,120,051 B2 | 10/2006 | Gorobets et al. |
| 7,129,759 B2 | 10/2006 | Fukami |
| 7,135,910 B2 | 11/2006 | Cernea |
| 7,135,911 B2 | 11/2006 | Imamiya |
| 7,208,996 B2 | 4/2007 | Suzuki et al. |
| 7,224,591 B2 | 5/2007 | Kaishita et al. |
| 7,227,780 B2 | 6/2007 | Komori et al. |
| 7,239,192 B2 | 7/2007 | Tailliet |
| 7,253,676 B2 | 8/2007 | Fukuda et al. |
| 7,259,612 B2 | 8/2007 | Saether |
| 7,276,960 B2 | 10/2007 | Peschke |
| 7,279,957 B2 | 10/2007 | Yen |
| 7,345,928 B2 | 3/2008 | Li |
| 7,368,979 B2 | 5/2008 | Govindu et al. |
| 7,397,677 B1 | 7/2008 | Collins et al. |
| 7,436,241 B2 | 10/2008 | Chen et al. |
| 7,468,628 B2 | 12/2008 | Im et al. |
| 7,495,500 B2 | 2/2009 | Al-Shamma et al. |
| 7,521,978 B2 | 4/2009 | Kim et al. |
| 7,554,311 B2 | 6/2009 | Pan |
| 7,579,903 B2 | 8/2009 | Oku |
| 7,671,572 B2 | 3/2010 | Chung |
| 7,696,812 B2 | 4/2010 | Al-Shamma et al. |
| 7,772,914 B2 | 8/2010 | Jung |
| 7,795,952 B2 | 9/2010 | Lui et al. |
| 7,956,673 B2 | 6/2011 | Pan |
| 7,969,235 B2 | 6/2011 | Pan |
| 7,973,592 B2 | 7/2011 | Pan |
| 8,093,953 B2* | 1/2012 | Pierdomenico et al. ...... 330/297 |
| 8,193,853 B2* | 6/2012 | Hsieh et al. ................... 327/536 |
| 2002/0008566 A1 | 1/2002 | Taito et al. |
| 2002/0014908 A1 | 2/2002 | Lauterbach |
| 2002/0075706 A1 | 6/2002 | Foss et al. |
| 2002/0130701 A1 | 9/2002 | Kleveland |
| 2002/0140463 A1 | 10/2002 | Cheung |
| 2003/0128560 A1 | 7/2003 | Saiki et al. |
| 2003/0214346 A1 | 11/2003 | Pelliconi |
| 2004/0046603 A1 | 3/2004 | Bedarida et al. |
| 2005/0093614 A1 | 5/2005 | Lee |
| 2005/0195017 A1 | 9/2005 | Chen et al. |
| 2005/0237103 A1 | 10/2005 | Cernea |
| 2005/0248386 A1 | 11/2005 | Pan et al. |
| 2006/0098505 A1 | 5/2006 | Cho et al. |
| 2006/0114053 A1 | 6/2006 | Sohara et al. |
| 2006/0244518 A1 | 11/2006 | Byeon et al. |
| 2006/0250177 A1 | 11/2006 | Thorp et al. |
| 2007/0001745 A1 | 1/2007 | Yen |
| 2007/0053216 A1 | 3/2007 | Alenin |
| 2007/0069805 A1 | 3/2007 | Choi et al. |
| 2007/0126494 A1 | 6/2007 | Pan |
| 2007/0139099 A1 | 6/2007 | Pan |
| 2007/0139100 A1 | 6/2007 | Pan |
| 2007/0211502 A1 | 9/2007 | Komiya |
| 2007/0222498 A1 | 9/2007 | Choy et al. |
| 2007/0229149 A1 | 10/2007 | Pan et al. |
| 2008/0012627 A1 | 1/2008 | Kato |
| 2008/0024096 A1 | 1/2008 | Pan |
| 2008/0042731 A1 | 2/2008 | Daga et al. |
| 2008/0111604 A1 | 5/2008 | Boerstler et al. |
| 2008/0116963 A1 | 5/2008 | Jung |
| 2008/0136500 A1 | 6/2008 | Frulio et al. |
| 2008/0157852 A1 | 7/2008 | Pan |
| 2008/0157859 A1 | 7/2008 | Pan |
| 2008/0218134 A1 | 9/2008 | Kawakami |
| 2008/0239802 A1 | 10/2008 | Thorp |
| 2008/0239856 A1 | 10/2008 | Thorp |
| 2008/0278222 A1 | 11/2008 | Conti et al. |
| 2008/0307342 A1 | 12/2008 | Furches et al. |
| 2009/0033306 A1 | 2/2009 | Tanzawa |
| 2009/0051413 A1 | 2/2009 | Chu et al. |
| 2009/0058506 A1 | 3/2009 | Nandi et al. |

| | | |
|---|---|---|
| 2009/0058507 A1 | 3/2009 | Nandi et al. |
| 2009/0063918 A1 | 3/2009 | Chen et al. |
| 2009/0091366 A1 | 4/2009 | Baek et al. |
| 2009/0121780 A1 | 5/2009 | Chen et al. |
| 2009/0153230 A1 | 6/2009 | Pan et al. |
| 2009/0153231 A1 | 6/2009 | Pan et al. |
| 2009/0153232 A1 | 6/2009 | Fort et al. |
| 2009/0167418 A1 | 7/2009 | Ragavan |
| 2009/0174441 A1 | 7/2009 | Gebara et al. |
| 2009/0219077 A1 | 9/2009 | Pietri et al. |
| 2009/0296488 A1 | 12/2009 | Nguyen et al. |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0074034 A1 | 3/2010 | Cazzaniga |
| 2010/0085794 A1 | 4/2010 | Chen et al. |
| 2010/0244935 A1 | 9/2010 | Kim et al. |
| 2011/0133820 A1 | 6/2011 | Pan |
| 2011/0148509 A1 | 6/2011 | Pan |

OTHER PUBLICATIONS

Louie Pylarinos et al., "Charge Pumps: An Overview", Department of Electrical and Computer Engineering University of Toronto, 7 pages.

Ang et al., "An On-Chip Voltage Regulator Using Switched Decoupling Capacitors," 2000 IEEE International Solid-State Circuits Conference, 2 pages.

U.S. Appl. No. 12/506,998 entitled "Charge Pump with Current Based Regulation" filed Jul. 21, 2009, 21 pages.

U.S. Appl. No. 12/634,385 entitled "Multi-Stage Charge Pump with Variable Number of Boosting Stages" filed Dec. 9, 2009, 33 pages.

U.S. Appl. No. 12/973,641, filed Dec. 20, 2010, 26 pages.

U.S. Appl. No. 12/973,493, filed Dec. 20, 2010, 28 pages.

U.S. Appl. No. 13/228,605, filed Sep. 9, 2011, 21 pages.

* cited by examiner

Charging Half Cycle

Transfer Half Cycle

HIGH VOLTAGE CHARGE PUMP REGULATION SYSTEM WITH FINE STEP ADJUSTMENT

FIELD OF THE INVENTION

This invention pertains generally to the field of charge pumps and more particularly to the regulation of charge pumps.

BACKGROUND

Charge pumps use a switching process to provide a DC output voltage larger than its DC input voltage. In general, a charge pump will have a capacitor coupled to switches between an input and an output. During one clock half cycle, the charging half cycle, the capacitor couples in parallel to the input so as to charge up to the input voltage. During a second clock half cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

FIG. 2 is a top-level block diagram of a typical charge pump arrangement. A pump 201 has as inputs a clock signal and a voltage Vreg and provides an output Vout. The high (Vdd) and low (ground) connections are not explicitly shown. The voltage Vreg is provided by the regulator 203, which has as inputs a reference voltage Vref from an external voltage source and the output voltage Vout. The regulator block 203 regulates the value of Vreg such that the desired value of Vout can be obtained. (A charge pump is typically taken to refer to both the pump portion 201 and the regulator 203, when a regulator is included, although in some usages "charge pump" refers to just the pump section 201.)

Charge pumps are used in many contexts. For example, they are used as peripheral circuits on EEPROM, flash EEPROM and other non-volatile memories to generate many of the needed operating voltages, such as programming or erase voltages, from a lower power supply voltage. For many of these uses, it important that the output is accurately regulated to the desired output level. A number of charge pump designs are know in the art, but given the common reliance upon charge pumps, there is an on going need for improvements in charge pump system design, including the regulation elements.

SUMMARY OF THE INVENTION

According to a first set of aspects, a charge pump system includes a charge pump circuit connected to receive a control signal and, in response to the control signal, provide an output voltage at an output node and regulation circuitry responsive a multi-hit digital value. The regulation circuitry includes a first comparator, having as output the control signal, a first input connected to receive a first reference voltage, and a second input connected to a first node; a first current branch connected between the output node and ground; and a second current branch connected between the output node and ground in parallel with the first current branch. The first current branch has a first variable resistance connected between the output node and the first node and a first fixed resistance connected between the first node and ground, where the value of the first variable resistance is determined by a first set of bits of the digital value. The second current branch includes a second variable resistance connected between the output node and ground, including a fixed portion and an adjustable portion having a value determined by a second set of bits of the digital value, the bits of the second set being of lesser significance than the bits of the first set of bits in the digital value. The second current branch also includes a unity gain op-amp section having a first transistor connected between the output node and the second variable resistance and a second comparator having an output connected to the control gate of the first transistor, a first input connected to receive a second reference voltage, and a second input connected to a node between the first transistor and the second variable resistance.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

The main aspects considered here related to charge pump systems and particularly to the regulation process for such systems. Conventional voltage regulation circuitry, such as the high voltage regulation system used for a charge pump to supply programming voltages VPGM for a non-volatile memory, uses resistor chains as voltage divider to control the VPGM level and step size. As technology scale down, and VPGM step size required finer increments, conventional VPGM regulator requires a larger resistor chain. The parasitic capacitance of this large resistor chain becomes dominant, increasing VPGM ripple. The regulator system use approach described below can reduce regulator resistors chains, minimize parasitic capacitance, and thus reduce VPGM ripple.

Figure 1A:
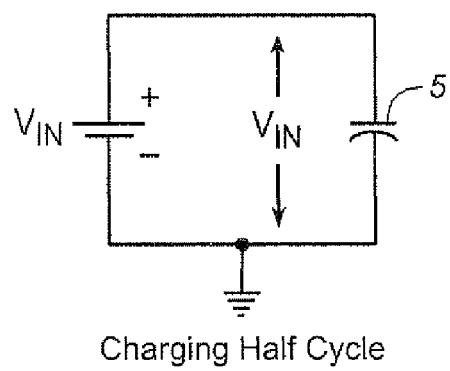
FIG. 1a is a simplified circuit diagram of the charging half cycle in a generic charge pump.
Figure 1B:
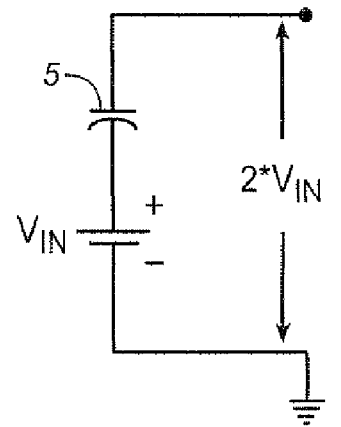
FIG. 1b is a simplified circuit diagram of the transfer half cycle in a generic charge pump.
Figure 2:
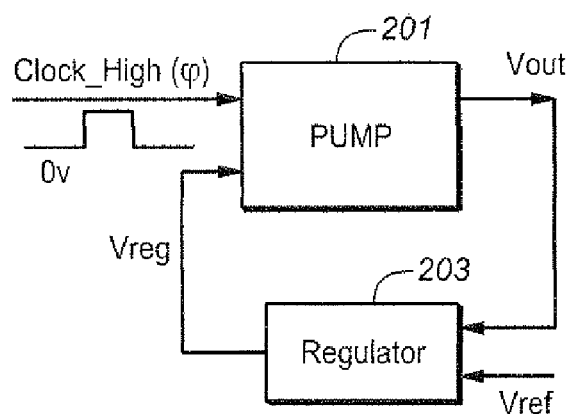
FIG. 2 is a top-level block diagram for a regulated charge pump.
Figure 3:
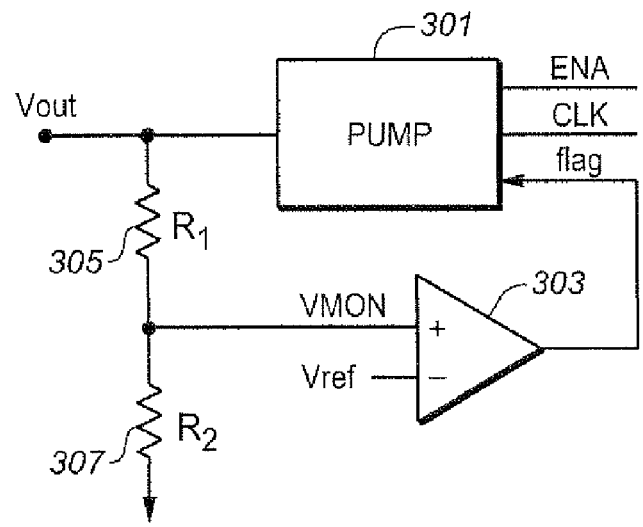
FIG. 3 shows more detail on the regulation circuitry.

FIG. 3 illustrates a conventional regulator system. The charge pump 301 has a clock signal CLK as input and is responsive to the enable signal ENA to generate the output voltage Vout. The regulation circuit uses a voltage divider of R1 305 and R2 307 connected in series between Vout and ground to generate voltage VMON that is compared to compare with a reference voltage, VREF, in the comparator 303 to generate a FLAG. The clock CLK can then be gated with this FLAG signal to produce a charge pump clock. The reference value is based on a reliably know value, such as from a band gap generator and the rations of R1 and R2 are then taken to set the desired Vout value in terms of VREF.

Charge pumps are typically used as peripheral elements are a circuit that needs higher voltages than the supply level. An example is a non-volatile memory, such as flash memory, where charge pumps are used to provide the high voltages used in programming and erasing memory cells, and also for the various voltages used in sensing and verifying the memory cells. In such arrangements, a number of different, accurately determined values may be needed, such the programming voltages of each of the steps in a programming staircase type waveform, or the many voltages levels used for sensing in multi-state NAND arrays. (More detail on such memory systems can be found in US patent publication US-2009-0296488-A1, for example.) The arrangement shown in FIG. 3 is limited to provide a single regulated value as the ratio of resistances in the regulation circuit is fixed. Multiple regulated outputs, such as needed for a programming voltage VPGM, can be provided by use of a variable resistive divider to provide the voltage compared to the reference value.

To control the VPGM level and step size, a binary input signal can be provided of, say, 9 bits can be used to vary the level. The 9 bits can be decoded into the 3 least significant bits, for the finer adjustments, and the 6 most significant bits, where the 6 bits of larger steps can be implemented as a single variable resistance connected in parallel below the VMON node with 3 smaller resistances for the finer increments. If one large resistor is turned on, this means less current and therefore VPGM level is regulated at a lower level. If many resistors in parallel are on, a larger current results and therefore a higher VPGM level. As VPGM step size requires smaller increments (50 mV, for example), more parallel resistors are added to create a finer step. Thus, a large resistor chain is required and more parasitic capacitance is added to VMON. Large parasitic capacitance at the VMON node makes it harder to detect small movement at VPGM, resulting in large VPGM ripple.

Figure 4:
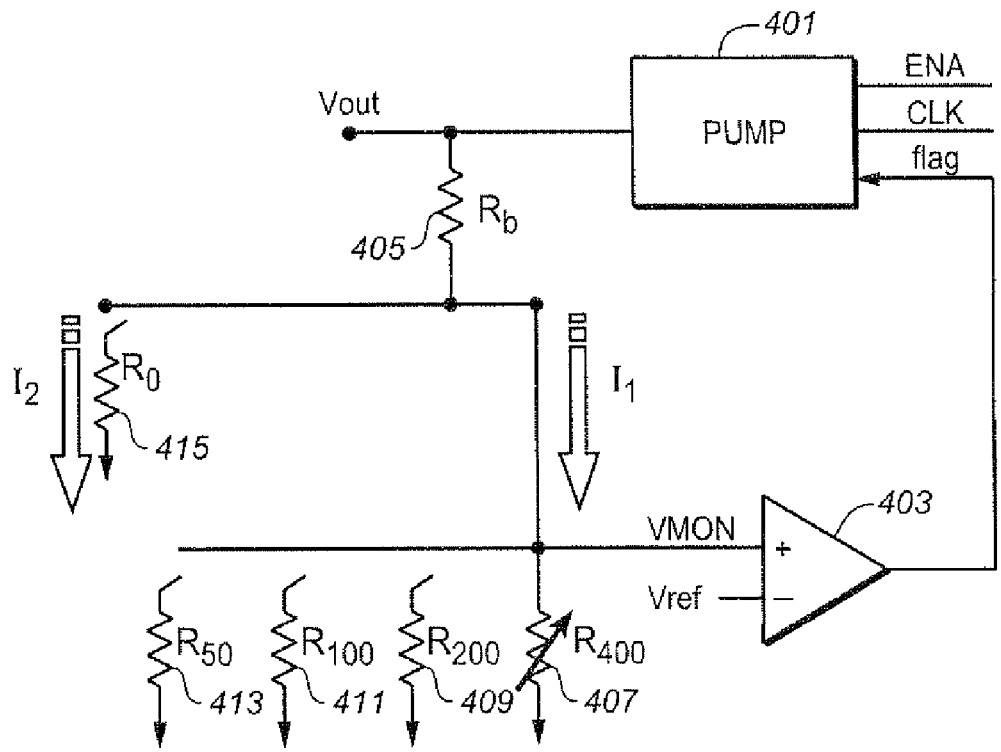
FIG. 4 is an example of regulation circuitry response to a multi-bit binary input.

FIG. 4 shows this sort of largely conventional high voltage regulation circuit. The pump 401 and comparator 403 can be more or less as before. To draw low current levels, the VREF can be taken as, say, 0.4V. The resistor Rb 405 above the VMON node is again fixed, but the variable resistance below the VMON node is as described in the last paragraph. In this example, the step size is taken as 50 mV. The variable resistance $R_{400}$ 407 will be adjustable in 400 mV steps, being controlled by the 6 most significant bits of the digital input. For example, $R_{400}$ 407 could be implement as a string of resistance connected in series that can be tapped at various points based on the decode value of these 6 bits (that is, a thermometer-coded DAC, or thermo decode, resistance). The three least significant bits are 50 mV, 100 mV, and 200 mV steps respectively effected by $R_{50}$ 413, $R_{100}$ 411, and $R_{200}$ 409. By using 6 bits decoded for $R_{400}$ 407 and 3 bits for $R_{50}$ 413, $R_{100}$ 411, and $R_{200}$ 409, the arrangement of FIG. 4 can cover a range of 8.0V-33.5V in steps of 50 mV.

To provide a regulated output voltage range of 3.0V-28.5V with step size of 50 mV for use in erase operation, the resistor $R_{offs}$ 415 can be selectively connected between the VMON node and ground to offset the output range, lowering it by 5V. When $R_{offs}$ 415 is connected, the current out of Rb 405 is split into I1 though the adjustable resistances to provide the steps size and I2 though $R_{offs}$ 415 to lower the range to start at 3V for erase operations.

Although this arrangement can provide the desired step size over the desired range, the resistances connected in parallel must be taken quite large to avoid drawing excessive current. An actual example would use something like a total of ~56M ohm due to the DAC resistors in arranged parallel. Such a large resistor chain will add a large amount of parasitic capacitance to VMON, making it harder to pick up small variation in the output at VPGM, resulting in large amount of output ripple. Consequently, it would quite useful to find a way to use smaller resistance values, thereby decreasing this parasitic capacitance and also needed area for resistors, while still drawing a relatively small amount of current.

The main discussion here is related to the regulation circuitry of the charge pump system and how the output voltage is compared with the reference level in order to generate the control signals used for regulation. With respect to the charge pump itself, any of the various designs (voltage doubler, Dickson type, and so on) can be used. Similarly, there are many ways for how the output is regulated based upon the control signal, such as varying the frequency of the input clock signal, the amplitude of the input voltage, the number of stages, and so on. More details on these aspects, which can be applied to the exemplary embodiments below as well as to the examples above can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979; 7,795,952; 7,135,910; 7,973,592; and 7,969,235; US Patent Publication numbers 2009-0153230-A1; 2009-0153232-A1; 2009-0315616-A1; 2009-0322413-A1; 2009-0058506-A1; US-2011-0148509-A1; 2007-0126494-A1; 2007-0139099-A1; 2008-0307342 A1; and 2009-0058507 A1; and applications Nos. 12/973,641 and 12/973,493, both filed Dec. 20, 2010. In addition, two specific examples of charge pump systems where the regulation circuitry described here can employed can be found in U.S. patent application Ser. No. 13/228,605, filed Sep. 9, 2011, and a U.S. patent application Ser. No. 13/240,664, entitled "Dynamic Switching Approach to Reduce Area and Power Consumption of High Voltage Charge Pumps" by Qui Vi Nguyen, Khin Htoo, and Jonathan Huynh, that is being filed concurrently herewith.

To overcome the imitations described above, a main aspect of the charge pump system presented here uses a regulator system that divides the binary decoding into two branches. One controls a set of parallel connected resistors for fine the VPGM step. The other controls a serial resistor to provide large step size. The exemplary embodiment, discussed with respect to FIG. 5, will a 9-bit digital input signal, split into 2 least significant for the fine adjustment and the other 7 bits for the larger adjustments, and a 50 mV step size, although the discussion readily extends to other numbers of bits, a different splitting of these bits, a different step size, or any combination of these. In the example, in one current path 2 bits of the binary input control two parallel resistors for 50 mV and 100 mV step size, and in the other current path 7 bits are used for one-hot-decode control serial resistors to provide a 200 mV step size. A unity gain operational amplifier and a high voltage (HV) device are added in between the two branches to decouple the parasitic capacitance of large parallel resistors from the other elements. Thus, the sensing node VMON consequently has less parasitic capacitance and is more sensitive to VPGM movement, resulting in less ripple at the output node VPGM.

Referring now to FIG. 5, a pump 501 again receives the inputs of an enable signal ENA, a clock signal CLK, and the control signal FLAG and produces the output voltages Vout, such as a programming voltage VPGM. The comparator 503 of the control circuitry supplies the FLAG signal by comparing a reference voltage VREF to the voltage at the node TAP, which is derived from Vout. Here the reference voltage VREF higher than described above with respect to FIG. 4 as the amount of current drawn in this design is less and a higher values, such as VREF=~1.2V, is used to reduce bounce. A fixed resistance Rstep 505 is connected to the output of the node, after which the circuit splits into a first branch, with current I1, and a second branch, with current I2, connected in parallel.

The comparison node TAP is taken from an internal node of the second branch above a fixed resistance $R_{base}$ 517. The resistance $R_{200}$ 507 is adjustable in increments of 200 mV, in response to the 7 most significant bits of the binary input signal. (This can again be a chain of series connected resistors that can be tapped at a point based on the input signal.) The 9-bit (in this example) binary signal can be provided from the state machine (not shown) on the memory chip or other control circuitry, where, depending on the program and erase levels needed, the 9-bits will generated accordingly. To allow for the offset in output voltage when used for erase operations, a resistor $R_{offs}$ 515 is connected in series with $R_{base}$ 517. (Here, $R_{offs}$ 515 is connected above $R_{base}$ 517, but that could be switched or otherwise arranged, depending on the embodiment.) $R_{offs}$ 515 can selectively be bypassed to shift the levels of Vout to start at a lower value, here to start Vout at 3V for erase levels.

The second branch, with current I2, uses two binary bits for the fine 50 mV and 100 mV steps. The current I2 flows through the transistor 523 to the parallel connected resistors $R_0$ 509, $R_{100}$ 511, and $R_{50}$ 513 and on to ground. The fixed portion $R_0$ 509 of these resistors is included to provide a constant resistance path for I2 to ground. The resistors $R_{100}$ 511 and $R_{50}$ 513 respectively selectively connectable to supply 100 mV and 50 mV steps for Vout when under regulation. The gate of the transistor 523 is connected controller by the output of operational amplifier 521, which has one input connected to receive a reference voltage VREF (here the same reference value as used for 503, ~1.2V in this example) and the other input connected to take feedback from the node X below the transistor 523. The comparator 521 and transistor 523 work together as a unity gain op-amp to set the node X to VREF (here ~1.2V). As the system here is for use with high voltages, a transistor 525 is placed above the transistor 523, although in other applications this may not be needed. For the exemplary embodiment, the gate of transistor 525 can be set at about the ~4v level. More generally, when such a protective device is needed, its gate setting level should be such as to pass about 4v to source side of the high voltage NMOS 525. This is to protect NMOS 523, since it should not see a level higher than 5v. Alternately, in other high voltage situations, the circuit can use a high voltage NMOS for 523 and remove the NMOS 535, but the use of low voltage transistor at 523 is selected here for better gain and process variation.

This arrangement can provide the desired small step size in Vout, such as needed in VPGM values, with small amounts of ripple. For the exemplary embodiment, the step size is again 50 mV with the same range as for FIG. 4, with 2 binary bits used for the 50 mV and 100 mV steps (by $R_{50}$ 513 and $R_{100}$ 511, respectively) and the 7 most significant bits in one hot decode with a 200 mV step size. The use of the unity gain arrangement of 521 and 523 provides for a constant current flow of I2 through the set of resistors below node X, where the current I2 will be equal to the VREF divided by selected resistors, with the same current through Rstep 505 to determine the fine step size. The fine step size from $R_{50}$ 513 is then $(VREF/R_{50})*R_{step}=1.2*(R_{step}/R_{50})$, with $R_{100}$ 511 providing an increment determined by $1.2*(R_{step}/R_{100})$. Similarly, the voltage increment provided by $R_{200}$ 507 is $1.2*(R_{200}/Rbase)$.

Figure 5:
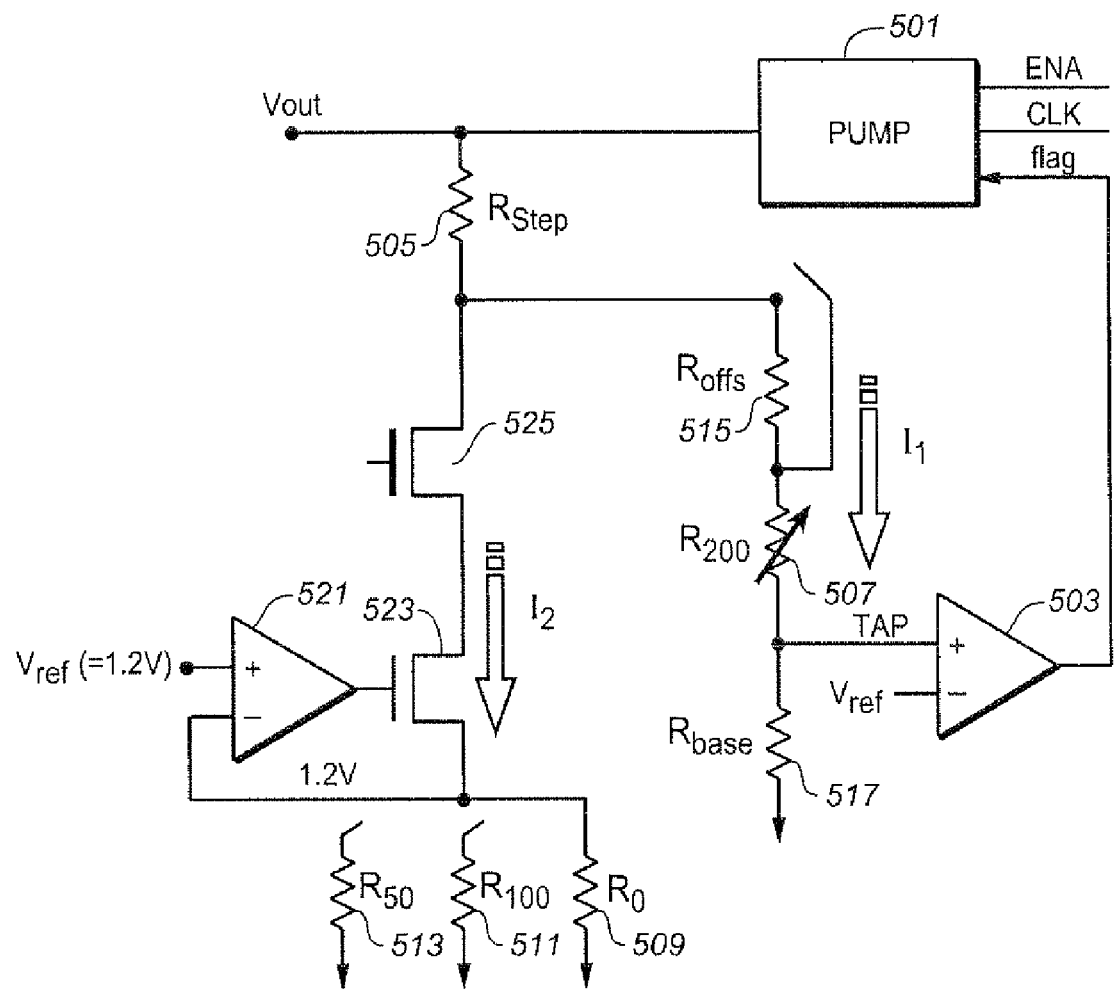
FIG. 5 is an exemplary embodiment of a charge pump system with fine step adjustment.

The arrangement of FIG. 5 divides the binary decoding for Vout into two branches, one of the parallel resistances for the fine Vout steps and the other of serial resistors to provide the larger step size. This subdivision of the resistance ladder into two branches, one parallel and one serial, and separating of them by an operational amplifier, minimizes the capacitive load at the TAP input of the comparator 503. As a result, the regulator system responds faster to changes in the Vout level. The exemplary embodiment uses 2 bits to control 2 parallel resistors for 50 mV and 100 mV step size, and 7 other bits for one-hot-decode control serial resistors to provide 200 mV step size, but other values can be used as appropriate for the application. Additionally, although the regulation circuitry is here connected between Vout and ground (or, more generally, the low voltage level on the chip), the arrangement could be modified for use with negative charge pumps.

Consequently, the exemplary embodiment of FIG. 5 has the advantages of a regulator area is smaller when compared to a conventional scheme, less output ripple, and better DAC linearity. The unity gain operational amplifier and (optional) HV device are added in between the two branches to decouple the parasitic capacitance of the large parallel resistors from the other leg, where the comparison is made with the reference level to generate the FLAG signal. Thus, sensing node (TAP) has less parasitic capacitance, and it is therefore more sensitive to VPGM movement, resulting in a decrease in ripple at VPGM.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A charge pump system, comprising:
   a charge pump circuit, connected to receive a control signal and in response thereto, provide an output voltage at an output node; and
   regulation circuitry responsive a multi-bit digital value, including:
      a first comparator, having as output the control signal, a first input connected to receive a first reference voltage, and a second input connected to a first node;
      a first current branch connected between the output node and ground, comprising:
         a first variable resistance connected between the output node and the first node, the value of the first variable resistance is determined by a first set of bits of the digital value;
         a first fixed resistance connected between the first node and ground;
      a second current branch connected between the output node and ground in parallel with the first current branch, the second current branch comprising:
         a second variable resistance connected between the output node and ground, including a fixed portion and an adjustable portion having a value determined by a second set of bits of the digital value, the bits of the second set being of lesser significance than the bits of the first set of bits in the digital value; and a unity gain op-amp section, including:

a first transistor connected between the output node and the second variable resistance; and a second comparator having an output connected to the control gate of the first transistor, a first input connected to receive a second reference voltage, and a second input connected to a node between the first transistor and the second variable resistance.

2. The charge pump system of claim 1, where the digital value is of N bits with the bits of the first set being the M most significant bits of the digital value and the second set being the (N-M) least significant bits of the digital value, where M and N are positive integers, N being greater than M.

3. The charge pump system of claim 1, wherein the second variable resistance comprises:

N resistances selectively connectable between the output node and ground in parallel with a second fixed resistance in response to the N least significant bits of the digital value.

4. The charge pump system of claim 1, wherein the first and second reference voltages are of the same value.

5. The charge pump system of claim 1, wherein the second current branch further comprises:

a second transistor connected as a high-voltage protection element in series with the first transistor between the output node and the first transistor.

6. The charge pump system of claim 1, wherein the first current branch further comprises:

an offset resistance selectively connectable between the output node and the first node in series with the first variable resistance.

7. The charge pump system of claim 1, wherein the regulation circuitry further comprising:

a second fixed resistance, wherein the first and second current branches are both connected to the output node through the second fixed resistance.

* * * * *